(12) United States Patent
Huang et al.

(10) Patent No.: US 11,757,615 B2
(45) Date of Patent: Sep. 12, 2023

(54) WIDEBAND PHASE-LOCKED LOOP FOR DELAY AND JITTER TRACKING

(71) Applicant: NVIDIA Corporation, Santa Clara, CA (US)

(72) Inventors: Yi-Chieh Huang, Zhubei (TW); Ying Wei, San Jose, CA (US); Chung-Ru Wu, Taoyuan (TW); Bo-Yu Chen, Taichung (TW); Haiming Tang, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 17/521,580

(22) Filed: Nov. 8, 2021

(65) Prior Publication Data

US 2023/0141897 A1 May 11, 2023

(51) Int. Cl.
*H04L 7/033* (2006.01)
*H03L 7/099* (2006.01)
*H03L 7/091* (2006.01)

(52) U.S. Cl.
CPC ............ *H04L 7/0338* (2013.01); *H03L 7/091* (2013.01); *H03L 7/0998* (2013.01)

(58) Field of Classification Search
CPC ........... H04L 7/0338; H04L 2027/0067; H04L 2027/0069; H03L 7/091; H03L 7/0998; H03L 7/0995; H03L 7/0997
See application file for complete search history.

(56) References Cited

U.S. PATENT DOCUMENTS

| | | | | |
|---|---|---|---|---|
| 9,577,815 | B1* | 2/2017 | Simpson | H04L 25/49 |
| 11,405,025 | B1* | 8/2022 | Hao | H03L 7/0995 |
| 2008/0317188 | A1* | 12/2008 | Staszewski | H03L 7/0991 |
| | | | | 375/376 |
| 2021/0111859 | A1* | 4/2021 | Gaade | H03L 7/0998 |
| 2022/0200609 | A1* | 6/2022 | Hiyama | H03L 7/081 |
| 2022/0200654 | A1* | 6/2022 | Baier | H04L 27/38 |

* cited by examiner

*Primary Examiner* — Khanh C Tran
(74) *Attorney, Agent, or Firm* — LOWENSTEIN SANDLER LLP

(57) ABSTRACT

A device includes feed-forward clock circuitry to provide a receiver (RX) clock to a sampler circuit that samples a data lane of a set of RX data lanes, the feed-forward clock circuitry having a temperature-induced delay. The device also includes an RX phase-locked loop (PLL) coupled between the feed-forward clock circuitry and the sampler circuit. The RX PLL includes a phase interpolator positioned in a feedback path of the RX PLL. The phase interpolator has a negative delay that matches the temperature-induced delay of the feed-forward clock circuitry to cause the sampler circuit to cancel out the common noise shared between the feed-forward clock circuitry and the data lane.

20 Claims, 5 Drawing Sheets

WIDEBAND PHASE-LOCKED LOOP FOR DELAY AND JITTER TRACKING

TECHNICAL FIELD

At least one embodiment pertains to processing resources used to perform and facilitate network communication. For example, at least one embodiment pertains to technology for wideband phase-rotating phase-locked loop delay and jitter tracking.

BACKGROUND

Network devices that employ serializer/deserializer (SerDes) technology operate off a multiphase clock generated for the timing of multiple data lanes. The data lanes are arranged between a data amplifier and multiple sampler circuits, which, for example, feed data to a deserializer within a receiver (RX) of a high-speed link device. A separate clock lane can be employed in the multiphase clock generation to account for delays in the data lanes, and as delay mismatch increases, the clock lane can require from 25-30 or more stages to match the delay in the data lanes. The longer clock lane increases jitter, such as power supply induced jitter (PSIJ), deterministic jitter (DJ), and random jitter (RJ) exhibited in the clock lanes. Further, the longer clock lane can create timing offsets due to temperature and supply voltage variations, making delay matching more difficult.

BRIEF DESCRIPTION OF DRAWINGS

Various embodiments in accordance with the present disclosure will be described with reference to the drawings, in which.

DETAILED DESCRIPTION

Figure 1:
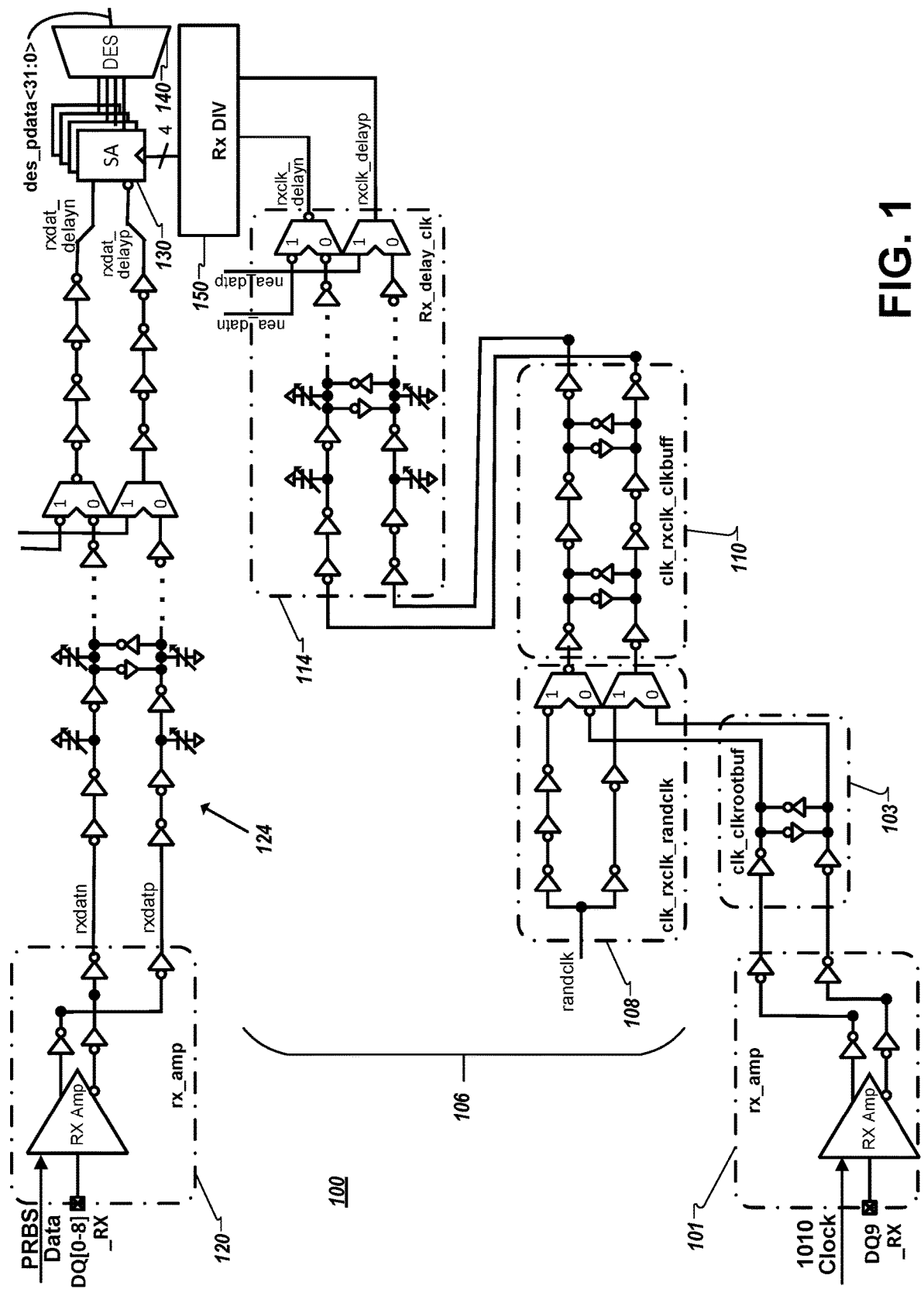
FIG. 1 is a circuit diagram of a data deserializer system in a receiving (RX) link device that employs delay line structures to match delay between a clock lane and multiple data lanes, in accordance with at least some embodiments.

As described above, it can be challenging to match delay between a clock lane and data lanes in receiver architecture of a receiving (RX) link device or other similar high-speed SerDes link device and to do so while also tracking common noise experienced by the clock lane and the data lanes so that sampler circuits of the data lanes can cancel this common noise. This common noise can include supply noise, delay drift, and/or correlated jitter. Further, for multiple channels defined by the data lanes, phase skew is dispersed differently across the data lanes (e.g., greater than 10 picoseconds (ps) different), making it more difficult to also account for phase offsets between the data and clock lane. Therefore, the receiver architecture is challenged with both aligning phase timing between the data lanes and the clock lane and aligning the clock to the data eye center, e.g., account for delays between the data lanes and the clock lane, which temperature and supply voltage deviations can exacerbate. Further, there is generally no closed-loop clock and data recovery (CDR) circuitry, making it difficult to adjust for these types of deviations and other circuit variations.

Aspects of the present disclosure address the above and other deficiencies through employing feed-forward clock circuitry (e.g., via a feed-forward clock path) and a phase-locked loop (PLL) positioned between the feed-forward clock circuitry and a set of sampler circuits that sample data from a set of data lanes. In various embodiments, the feed-forward clock circuitry provides a receiver (RX) clock to a sampler circuit that samples a data lane of the set of RX data lanes. The feed-forward clock circuitry has a temperature-induced delay experienced between an RX clock amplifier and the set of data sampler circuits. An RX PLL is coupled between the feed-forward clock circuitry and the sampler circuit to handle canceling out the temperature-induced delay so that the set of sampler circuits can cancel out common noise shared between the feed-forward clock circuitry and the data lane. This common noise can include, for example, supply noise, delay drift, and correlated random jitter. Other types of jitter may also be canceled out.

In at least some embodiments, the RX PLL includes a pulse width modulation (PWM) current source to directly modulate current provided to a ring oscillator of the RX PLL. The RX PLL further includes a phase detector to combine the RX clock with a feedback path from the PWM current source. The RX PLL further includes a phase interpolator positioned in the feedback path coupled between the ring oscillator and the phase detector. In these embodiments, the phase interpolator has a negative delay that matches the temperature-induced delay of the feed-forward clock circuitry, which thus causes the sampler circuit to cancel out common noise shared between the feed-forward clock circuitry and the data lane, as discussed. The phase detector can include a logic gate that oversamples inputs, which together with the direct modulation of current by the PWM current source, provides a maximum PLL bandwidth that exceeds one-tenth a frequency of the RX clock. This large bandwidth (e.g., wideband) PLL can thus track the common noise that is shared between the feed-forward clock circuitry and the set of RX data lanes.

Therefore, advantages of the systems and methods implemented in accordance with some embodiments of the present disclosure include, but are not limited to, tracking, for purposes of canceling, the above-referenced common noise that exists between feed-forward clock circuitry and a set of data lanes of a high-speed SerDes link device. This common noise can include supply noise, delay drift, and correlated random jitter, among other forms of jitter. Other advantages will be apparent to those skilled in the art of high-speed communication links also referred to as SerDes devices, which will be discussed hereinafter.

FIG. 1 is a circuit diagram of a data deserializer system 100 in a receiving (RX) link device that employs delay line structures to match delay between a clock lane and multiple data lanes, in accordance with at least some embodiments. While the system 100 relates to an RX link device that is understood to be a SerDes link device, the disclosed embodiments of the system 100 can also be applied to other multi-channel deserializer systems or another communication device that operates at high speed.

In at least some embodiments, the system 100 includes at least an RX clock amplifier 101, a clock root buffer 103 coupled to the RX clock amplifier 101, feed-forward clock circuitry 106 coupled to the clock root buffer 103, an RX data amplifier 120, a set of RX data lanes 124 coupled to the RX data amplifier 120, a set of sampler circuits 130 coupled to the set of RX data lanes 124, and a deserializer 140 coupled to an output of the set of RX sampler circuits 130. In these embodiments, the feed-forward clock circuitry 106 can include a random clock selector 108 with the option to select a random clock rather than the clock generated by the RX amplifier 101, an RX clock buffer 110, an RX clock delay line 114, and an RX divider (DIV) 150 coupled to the set of sampler circuits 130. The feed-forward clock circuitry 106 can also include additional circuitry and other stages not illustrated in FIG. 1, but has been simplified for purposes of explanation.

In at least some embodiments, the RX clock amplifier 101 amplifies an RX clock to generate an amplifier RX clock, which is buffered in the clock root buffer 103. The RX clock is also provided to a clock lane (e.g., SerDes clock lane) of the communication link device, which is not illustrated for simplification purposes. The RX clock can be understood to include a positive clock and a negative clock, thus the reason for the differential structure of the feed-forward clock circuitry 106, e.g., which provides a feed-forward clock path within the set of RX data lanes 124. The RX data amplifier 120 amplifies an RX data to generate an amplified RX data within the set of data lanes 124. In these embodiments, the set of sampler circuits 130 are configured to sample data from respective data lanes of the set of RX data lanes 124 according to a multiphase RX clock provided by the RX DIV 150. Each data lane of the set of RX data lanes 124 includes a positive data path and a negative data path, thus the reason for the differential structure.

In various embodiments, the feed-forward clock circuitry 106 includes a first set of inverters with a first delay. The set of RX data lanes 124 further includes a second set of inverters with a second delay. In some embodiments, these inverters are instead differential stages that create delay. One function of the RX clock delay line 114 of the feed-forward clock circuitry 106 is to match the first delay to the second delay, but this can be difficult due to temperature and supply voltage deviations, among other variations. Further, as discussed, the length of the feed-forward clock circuitry 106 increases jitter such as power supply induced jitter (PSU), deterministic jitter (DJ), and random jitter (RJ) that is also exhibited in the clock lane. Further, the longer clock lane can create phase offsets between the feed-forward clock circuitry 106 and the set of RX data lanes 124. These challenges in the delay structure design of the system 100 can be resolved by replacing latter portions of the feed-forward clock circuitry 106 (e.g., the RX DIV 150) with the disclosed RX PLL discussed hereinafter, which can simplify and improve the tracking and cancellation of common noise referred to previously.

Figure 2:
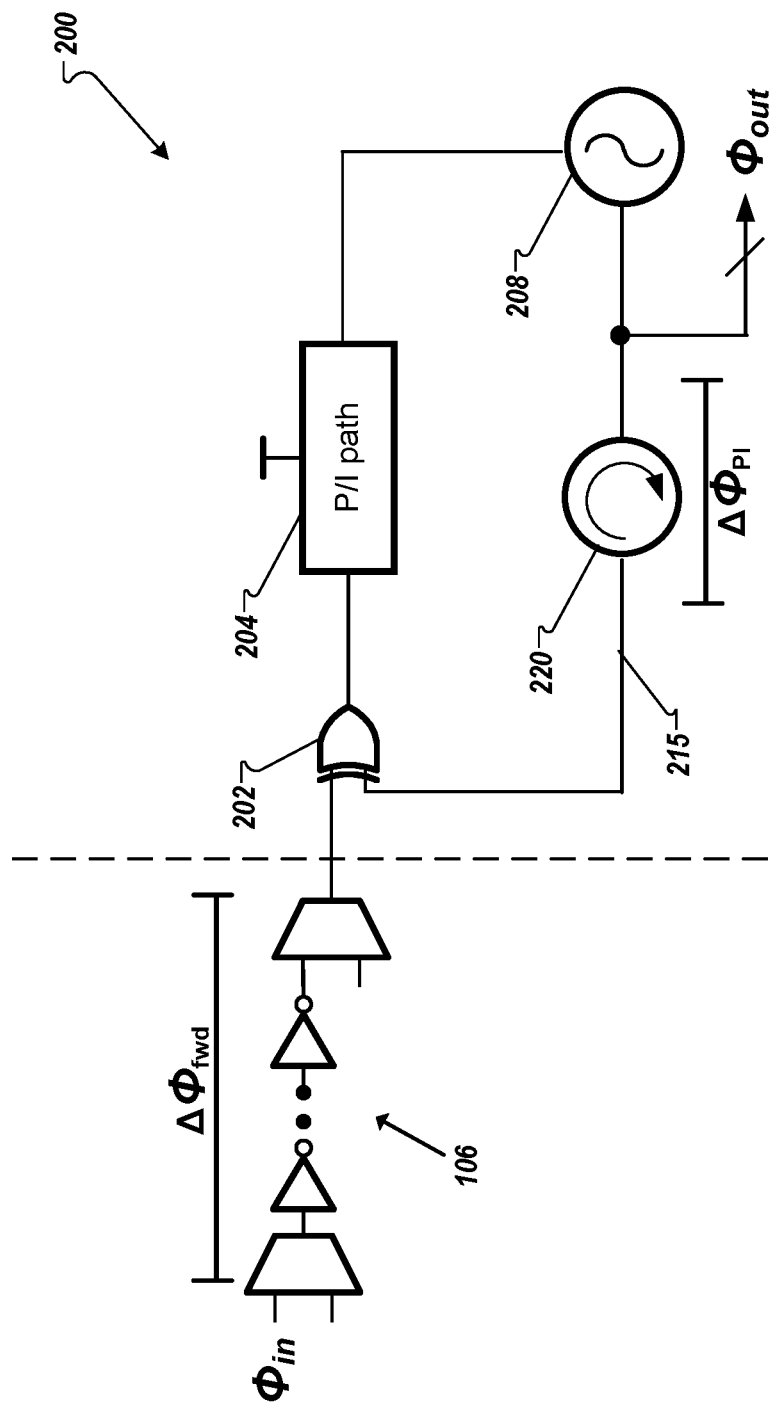
FIG. 2 is a simplified circuit diagram of an RX phase-locked loop (PLL) positioned within feed-forward clock circuitry to match the delay between the feed-forward clock circuitry and the RX data lanes illustrated in FIG. 1, in accordance with at least some embodiments.

FIG. 2 is a simplified circuit diagram of an RX PLL 200 positioned within the feed-forward clock circuitry 106 to match the delay between the feed-forward clock circuitry 106 and the set of RX data lanes 124 illustrated in FIG. 1, in accordance with at least some embodiments. In these embodiments, the RX PLL 200 includes a phase detector 202 coupled with a proportional-integral (P/I) path 204, which is in turn coupled with a ring oscillator 208, e.g., a voltage-controlled oscillator (VCO) in some embodiments.

The phase detector 202 sometimes is referred to as a phase-frequency detector. The RX PLL 200 can further include a phase interpolator 220 positioned in a feedback path 215 (or loop) of the RX PLL 200 coupled between the ring oscillator 208 and the phase detector 202. In some embodiments, the phase detector 202 is a logic gate such as an exclusive OR (XOR) gate, which receives, as inputs, the amplified RX clock from the feed-forward clock circuitry 106 and the output of the feedback circuitry 215 of the RX PLL 200. In this way, the phase detector 202 combines the amplified RX clock with the feedback path 215.

In at least some embodiments, the RX PLL 200 is configured to adjust the timing between the set of RX data lanes 124 and the clock lane, provide multiphase generation of the RX clock (e.g., single-phase in and multiphase out) for the set of sampler circuits 130, act as a phase domain filter in rejecting reference noise, and is configured to provide temperature-induced delay matching between at least the feed-forward clock circuitry 106 and the feedback path 215. For example, the input phase ($\phi_{in}$) of the amplified RX clock passed into the feed-forward clock circuitry 106 undergoes a feed-forward clock delay ($\Delta\phi_{fwd}$). Thus, the phase interpolator 220 can be configured to generate a negative delay ($-\Delta\phi_{PI}$) that matches the feed-forward clock delay ($\Delta\phi_{fwd}$) to cancel out the feed-forward clock delay, as illustrated in Equation (1).

$$\phi_{out}=\phi_{in}+\Delta\phi_{fwd}-\phi_{PI}$$

Based on this negative delay, the $\phi_{out}$ becomes equal to $\phi_{in}$. By setting this negative delay of the phase interpolator 220 equal to the delay of the feed-forward clock circuitry 106, the RX PLL 200 can set the time drift equal to the temperature drift that might cause such delay. By causing the feed-forward clock delay (e.g., a temperature-induced delay) match the negative delay of the phase interpolator 220, and configuring the RX PLL 200 with a wide bandwidth (as discussed with reference to FIG. 4), the set of sampler circuits 130 can cancel out common noise that is correctly timed between the feed-forward clock circuitry 106 and the set of data lanes 124.

Figure 3:
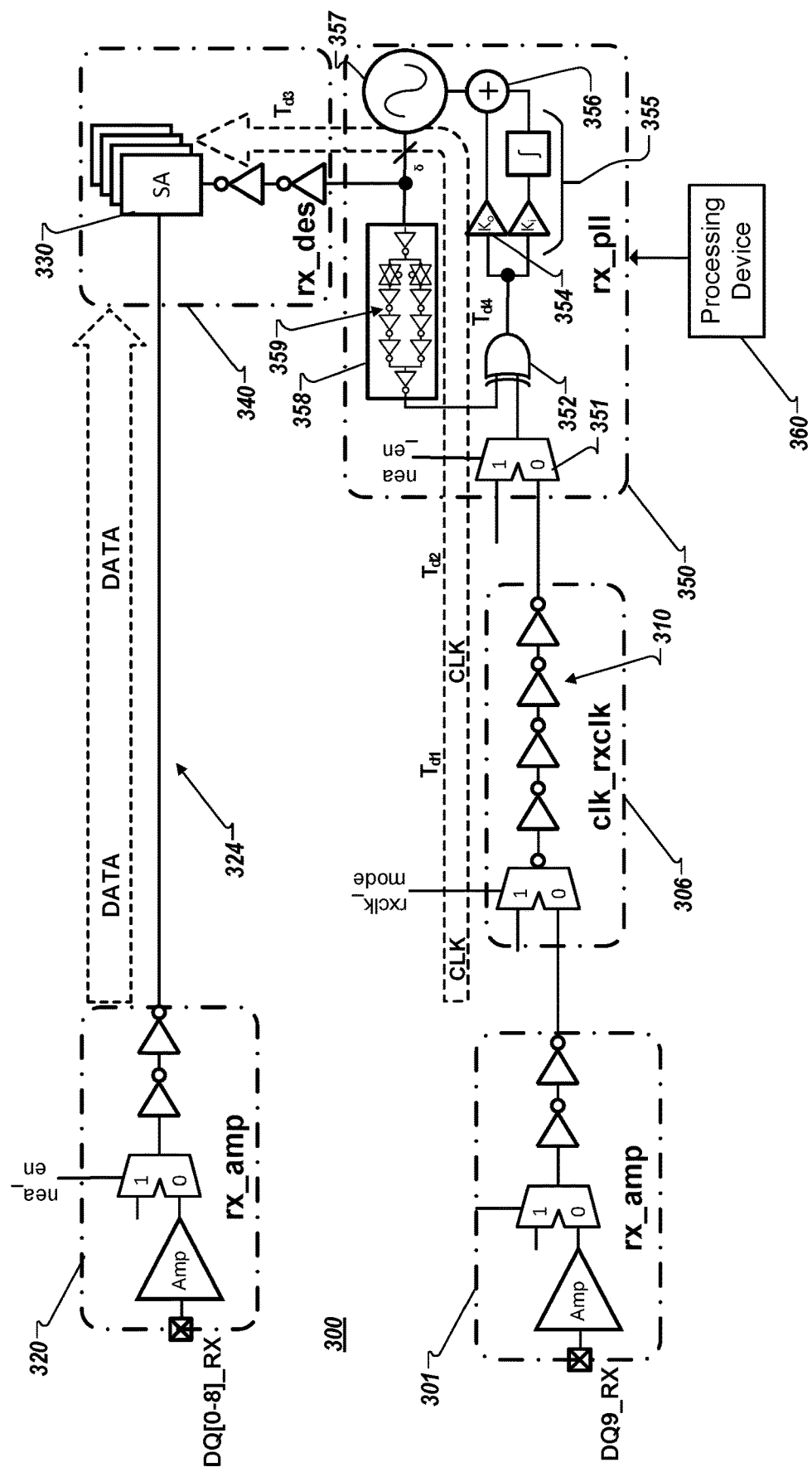
FIG. 3 is a simplified data deserializer system of the RX link device with a more-detailed PLL circuit, in accordance with at least some embodiments.

FIG. 3 is a simplified data deserializer system 300 of the RX link device with a more-detailed PLL circuit, in accordance with at least some embodiments. In these embodiments, the system 100 includes an RX clock amplifier 301, RX feed-forward clock circuitry 306, an RX data amplifier 320, a deserializer circuit 340, which includes a set of sampler circuits 330, and an RX PLL 350 coupled between the RX feed-forward clock circuitry 306 and the set of sampler circuits 330. The system 300 can further include a processing device 360 that can train the RX PLL 350 according to some embodiments discussed herein.

In at least some embodiments, the RX clock amplifier 301 amplifies an RX clock to generate an amplified RX clock, and the RX data amplifier 320 amplifies an RX data to generate an amplified RX data within a set of RX data lanes 324. The set of sampler circuits 330 is configured to sample the set of RX data lanes 324 according to a multiphase, corrected RX clock generated by the RX PLL 350 or according to a multiphase, corrected clock in another embodiments that is not an RX link device. The sampled data can be provided to an RX deserializer (not illustrated). The feed-forward clock circuitry 306 includes a first set of inverters 310 that have (or that can exhibit) a temperature-induced delay. In at least some embodiments, the inverter stages (or differential stages) of the first set of inverters 310 drive a heavy load and are intended to match inverter stages (or differential stages) of the set of RX data lanes 324. These inverter stages, however, are sensitive to temperature and can thus create temperature drift that generates an additional delay, which is the temperature-induced delay referred to herein.

In these embodiments, the RX PLL 350 is configured to generate the multiphase, corrected RX clock to be used for the timing of the set of sampler circuits 330. The RX PLL 350 can thus include, but not be limited to, a multiplexer 351, a phase detector 352, a proportional path circuit 354, an integral pass circuit 355, a summer 356, a ring oscillator 357, and a phase interpolator 358. In these embodiments, the processing device 360 can provide a selection signal (nea_en) to the multiplexer 351 to select the amplified RX clock from the RX feed-forward clock circuitry 306. The phase detector 352 can combine the amplified RX clock with an output of the phase interpolator 358 that is positioned within a feedback path from the ring oscillator 357. The phase detector 352 can be a logic gate such as an exclusive OR (XOR) gate to perform the logical combination of these clocks, although other types of logic gates are envisioned.

In at least some embodiments, an output of the phase detector 352 is fed to the proportional path circuit 354, which has an output that is fed to the summer 356, and to the integral path circuit 355, which has an output that is also fed to the summer 356, The summer 356, in turn, is coupled with the ring oscillator 357. The output of the summer 356 thus provides the current that drives the ring oscillator 357, which generates the output of the RX PLL 350, otherwise referred to herein as the multiphase, corrected RX clock that is provided to the set of sampler circuits 330.

In these embodiments, the phase interpolator 358 is positioned in a feedback path coupled between the ring oscillator 357 and the phase detector 352. The phase interpolator 358 includes a second set of inverters 359 having a negative delay that matches the temperature-induced delay of the first set of inverters 310, which causes the set of sampler circuits 330 to cancel out the common noise that exists between the feed-forward clock circuitry 306 and the set of RX data lanes 324. In these embodiments, the second set of inverters 359 include inverters that are numbered and sized identically to those of the first set of inverters 310 in order to match the delay that may be generated due to temperature drift. As mentioned, the inverters referred to herein can also be implemented as differential circuits.

Figure 4:
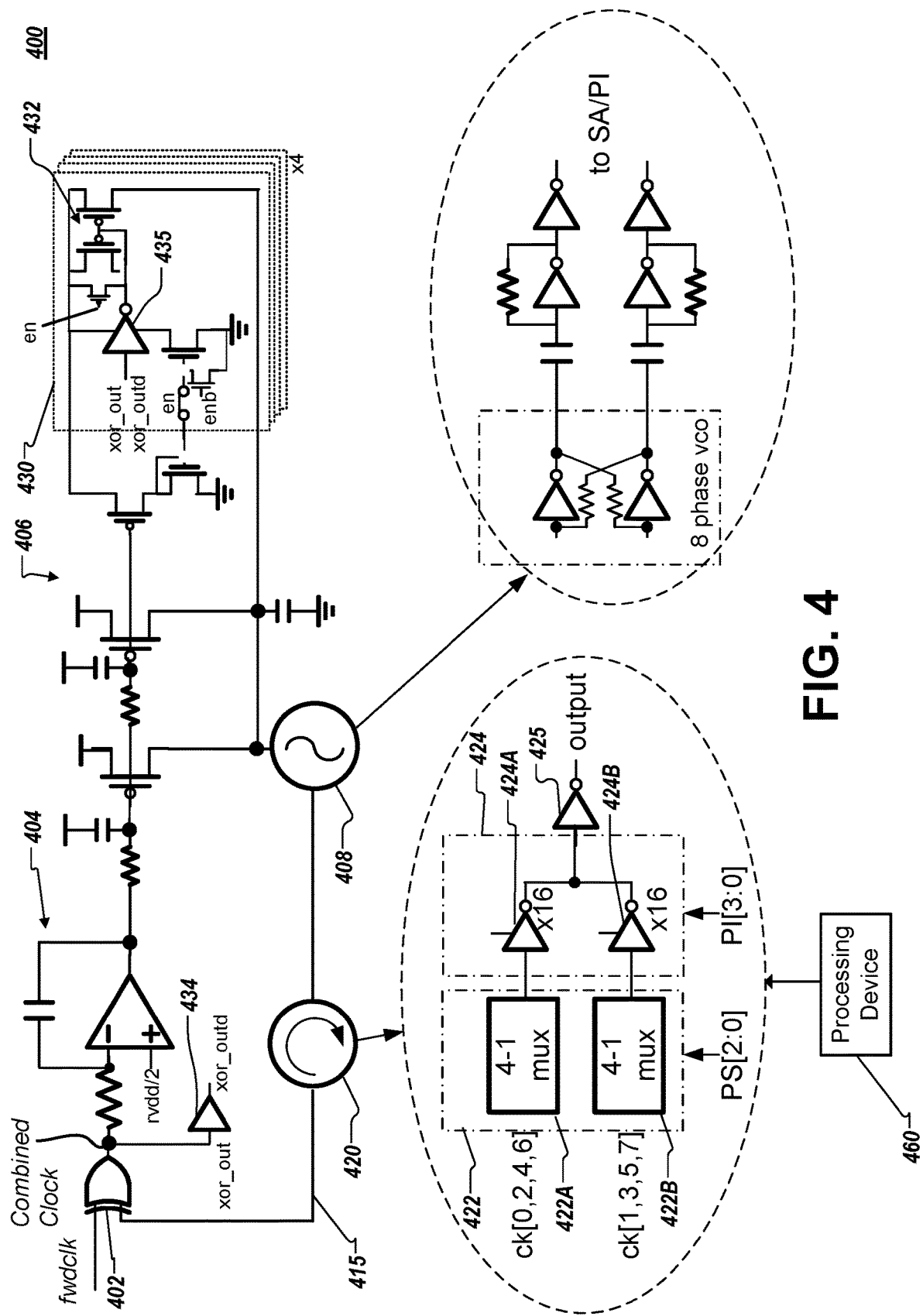
FIG. 4 is a more-detailed circuit diagram of a wide-bandwidth PLL in accordance with at least some embodiments.

FIG. 4 is a more-detailed circuit diagram of a wide-bandwidth RX PLL 400 in accordance with at least some embodiments. In some embodiments, the RX PLL 400 is the RX PLL 350 illustrated and discussed with reference to FIG. 3. In these embodiments, the RX PLL 400 includes a phase detector 402, integrator circuitry 404, oscillator driving circuitry 406, a pulse width modulation (PWM) current source 430, a ring oscillator 408, a phase interpolator 420, and a processing device 460. The phase detector 402 can be configured to combine the amplified RX clock (fwdclk) from the feed-forward clock circuitry 306 with a feedback path 415 from the PWM current source 430 (and the ring oscillator 408) to generate an output that is a combined clock. In some embodiments, the amplified RX clock (fwdclk) can be between approximately 8-12 GHz, and the combined clock output of the phase detector 402 can be between approximately 16-24 GHz, although other high-frequency ranges are envisioned, and these ranges are provided only for exemplary purposes.

In some embodiments, the phase detector 402 is a logic gate that receives the amplified RX clock and the feedback path 415 from the PWM current source 430. In some embodiments, this logic gate is an exclusive (OR) gate, although other logic gates are envisioned. In some embodiments, the phase detector 402 is a logic gate that over-samples inputs, e.g., at two times ("2×") a frequency of the amplified RX clock, meaning that the sampling rate is also increased to increase the bandwidth of the RX PLL 400.

In at least some embodiments, the phase interpolator 420 is positioned in the feedback path 415 coupled between the ring oscillator 408 and the phase detector 402. In various embodiments, the phase interpolator 420 includes a second set of inverters having a negative delay that matches the temperature-induced delay of the first set of inverters 310 (FIG. 3). Due to the increased bandwidth of the RX PLL 400, cancellation of the temperature-induced delay enables tracking of common noise between the feed-forward clock circuitry 306 and the set of RX data lanes 324, which can be canceled out (or substantially eliminated) by the set of sampler circuits 330 discussed with reference to FIG. 3.

In these embodiments, the PWM current source 430 is configured to directly modulate the current provided to the ring oscillator 408. The RX PLL 400 can further include a buffer 434 coupled between an output (xor_out) of the phase detector 402 and the PWM current source 430, e.g., supplying a combined clock (xor_outd) directly to the PWM current source 430. Specifically, the buffer 434 can be configured to directly supply the combination of the RX clock and an output of the phase interpolator 420 to PWM circuitry 432 of the PWM current source 430. In some embodiments, the combined clock (xor_out or xor_outd) is provided to an inverter 435 of the PWM current source 430, an output of which drives gates of a current mirror or the like of the PWM circuitry 432. In various embodiments, the oscillator driving circuitry 406 is coupled between the integrator circuitry 404 and the PWM current source 430, to enable the PWM circuitry 432 to selectively modulate current to the ring oscillator 408.

In some embodiments, the oversampling by the phase detector 402, together with this direct modulation of current by the PWM current source 430, provides a maximum PLL bandwidth that exceeds one-tenth a frequency of the amplified RX clock. This wide-bandwidth configuration of the RX PLL 400 enables the RX PLL 400 to track common noise that is shared between the feed-forward clock circuitry 306 and the set of RX data lanes 324 (FIG. 3), e.g., which causes the set of sampler circuits 330 to cancel out this common noise. As discussed previously, this common noise can include supply noise, delay drift, and/or correlated jitter such as MI (corresponding to the power supply), DJ, and/or RJ (corresponding to the delay drift). By increasing the bandwidth of the RX PLL 400, the feedback path 415 or loop exhibits shortened latency, and more of the common noise is present at the phase interpolator 420 to be canceled out, for example.

In various embodiments, the ring oscillator 408 is an eight-phase variable controlled oscillator (VCO), such as illustrated in the exploded view of the ring oscillator 408, although other types of oscillators are envisioned. The multiple phases generated by the ring oscillator 408 can be provided to both the set of sampler circuits 330 (FIG. 3) and the phase interpolator 420.

As discussed previously, in some embodiments, a phase offset exists between the set of RX data lanes 324 and the clock lane (not illustrated), which can be detected as a phase offset between the set of RX data lanes 324 and the feed-forward clock circuitry 306. In these embodiments, the phase interpolator 420 (illustrated in an exploded view) further includes a phase selector circuit 422 coupled to a delay selector circuit 424 coupled to a final output inverter

425, which feeds the phase detector 402 from the feedback path 415. The phase selector 422, for example, can include a first multiplexer 422A that can select from even-phased clocks and a second multiplexer 422B that can select from odd-phased clocks. Further, the delay selector circuit 424 can include a first selectable bank of inverters 424A and a second selectable bank of inverters 424B.

In these embodiments, the phase interpolator 420 receives a phase selector code (e.g., PS[2:0]) to select a set of adjacent phases of a clock signal from the ring oscillator that is to be mixed or interpolated by the phase interpolator 420. For example, the phase selector code can select a first phase to be passed by the first multiplexer 422A and a second phase, which is adjacent to the first phase, to be passed by the second multiplexer 422B. The phase interpolator 420 can further receive a phase interpolator code (e.g., PI[3:0]) to select a set of inverters from a bank of inverters that provide an output of the phase interpolator 420. For example, the phase interpolator code can cause selection of a first set of inverters from the first selectable bank of inverters 424A and a second set of inverters from the second selectable bank of inverters 424B. In some embodiments, inverters of the first set of inverters are made to match the number and type of those of the second set of inverters to provide a matching delay to the phase interpolator 420. In other embodiments, inverters of the first set of inverters differ in number and/or type from those of the second set of inverters. In either case, the delay of the first/second sets of inverters can be selected to match the temperature-induced delay of the feed-forward clock circuitry 306.

In at least some embodiments, the processing device 460 is coupled with the set of RX data lanes 324, the feed-forward clock circuitry 106, and the phase interpolator 420. In these embodiments, the processing device 460 is programmed (or otherwise configured) to provide the phase selector code and the phase interpolator code to the phase interpolator 220 to train the RX PLL 400 according to relative phases between the feed-forward clock circuitry 306 and one or more data lane of the set of RX data lanes 324. The training can be performed by tuning the phase interpolator 420 by adjusting the phase selector code and the phase interpolator code to reduce phase offset between the feed-forward clock circuitry 306 and the RX data lanes 324.

Figure 5:
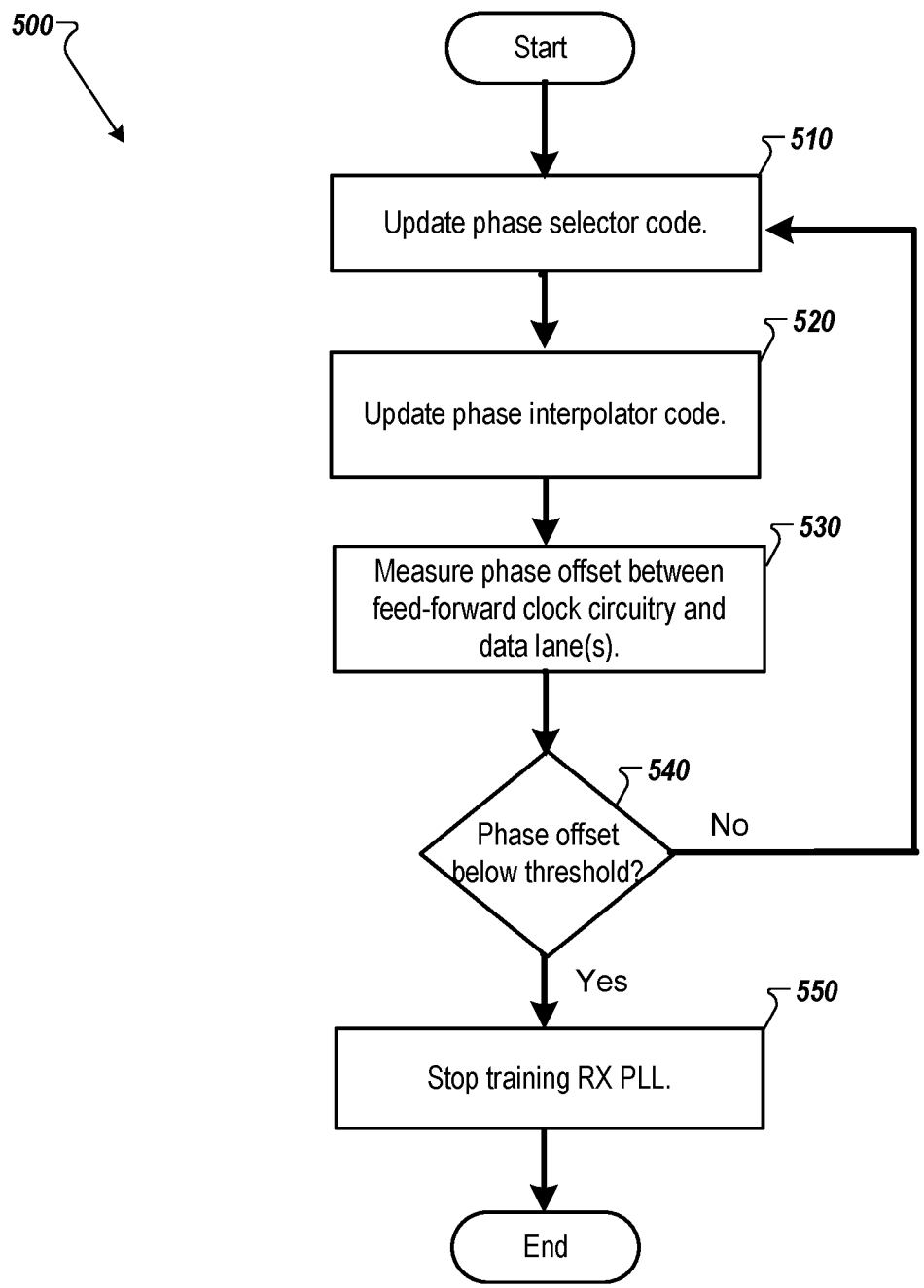
FIG. 5 is a flow diagram of an exemplary method for training an RX PLL to reduce phase offset between feed-forward clock circuitry and RX data lanes according to at least some embodiments.

FIG. 5 is a flow diagram of an exemplary method 500 for training the RX PLL 400 to reduce phase offset between the feed-forward clock circuitry 306 and the RX data lanes 324 according to at least some embodiments. The method 500 can be performed by processing logic comprising hardware, software, firmware, or any combination thereof. In at least one embodiment, the method 500 is performed by the processing device 360 or 460 of FIGS. 3-4. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic updates a phase selector code as was just discussed with reference to FIG. 4.

At operation 520, the processing logic updates a phase interpolator code as was just discussed with reference to FIG. 4.

At operation 530, the processing logic measures a phase offset between at least the feed-forward clock circuitry 306 and one or more data lanes of the set of RX data lanes 324, to determine the effect of the updates to the phase selector code and the phase interpolator code to the phase offset. Further, in some embodiments, the phase offset can be measured for additional accuracy between an entire data path channel (e.g., that includes the RX data amplifier 320 and the set of RX data lanes 324) and the entire feed-forward clock path channel (e.g., that includes the RX clock amplifier 301, the feed-forward clock circuitry 306, and the RX PLL 350).

At operation 540, the processing logic determines whether the phase offset is below a threshold reference phase offset that is programmed within or accessible to the processing logic. If the phase offset is not below the threshold reference phase offset, the method 500 loops back to operation 510 to enable further updating of the phase selector code (at operation 510) and the phase interpolator code (at operation 520), e.g., in further training iterations. In some embodiments, machine learning can be employed to perform the training.

Upon, at operation 540, determining that the phase offset has dropped below the threshold reference phase offset, at operation 550, the processing logic stops training the RX PLL 400 for phase offset.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A device comprising:
   feed-forward clock circuitry to provide a receiver (RX) clock to a sampler circuit and comprising a first plurality of inverters that cause a temperature-induced delay; and
   an RX phase-locked loop (PLL) coupled between the feed-forward clock circuitry and the sampler circuit, the RX PLL comprising a second plurality of inverters having a negative delay that matches the temperature-induced delay of the first plurality of inverters.

2. The device of claim 1, wherein the negative delay matching the temperature-induced delay causes the sampler circuit to cancel out common noise shared between the feed-forward clock circuitry and a data lane sampled by the sampler circuit, and wherein the common noise comprises at least one of supply noise, delay drift, or correlated random jitter.

3. The device of claim 1, wherein the second plurality of inverters comprise inverters that are numbered and sized according to those of the first plurality of inverters.

4. The device of claim 1, wherein the RX PLL further comprises:
   a pulse width modulation (PWM) current source to directly modulate current provided to a ring oscillator; and
   a phase detector to combine the RX clock with a feedback path from the PWM current source, wherein the phase detector comprises a logic gate that oversamples inputs, which together with the direct modulation of current by the PWM current source, provides a maximum PLL bandwidth that exceeds one-tenth a frequency of the RX clock.

5. The device of claim 4, wherein the RX PLL further comprises:
   a phase interpolator positioned in a feedback path of the RX PLL and that comprises the second plurality of inverters;
   the ring oscillator; and
   a buffer coupled between an output of the phase detector and the PWM current source, the buffer to directly supply a combination of the RX clock and an output of the phase interpolator to PWM circuitry of the PWM current source.

6. The device of claim 4, wherein the RX PLL further comprises a phase interpolator positioned in a feedback path and that comprises the second plurality of inverters, and wherein the phase interpolator is to receive:
   a phase selector code to select a set of adjacent phases of a clock signal from the ring oscillator; and
   a phase interpolator code to select a plurality of inverters from a bank of inverters that provide an output of the phase interpolator.

7. The device of claim 6, further comprising a processing device coupled with the feed-forward clock circuitry and the phase interpolator, the processing device to provide the phase selector code and the phase interpolator code to the phase interpolator to train the RX PLL according to relative phases between the feed-forward clock circuitry and a data lane sampled by the sampler circuit.

8. A system comprising:
   a receiver (RX) clock amplifier that amplifies an RX clock to generate an amplified RX clock;
   feed-forward clock circuitry coupled to the RX clock amplifier, the feed-forward clock circuitry comprising a first plurality of inverters that have a temperature-induced delay; and
   an RX phase-locked loop (PLL) coupled between the feed-forward clock circuitry and a set of sampler circuits, the RX PLL to generate a multiphase, corrected RX clock and that comprises a phase interpolator, the phase interpolator comprising a second plurality of inverters having a negative delay that matches the temperature-induced delay of the first plurality of inverters.

9. The system of claim 8, wherein inverters of the second plurality of inverters are numbered and sized identically to those of the first plurality of inverters, wherein the negative delay matching the temperature-induced delay causes the set of sampler circuits to cancel out common noise shared between the feed-forward clock circuitry and a set of data lanes sampled by the sampler circuit, and wherein the common noise comprises at least one of supply noise, delay drift, or correlated random jitter.

10. The system of claim 8, wherein the phase interpolator is positioned in a feedback path of the RX PLL, and wherein the RX PLL further comprises:
    a pulse width modulation (PWM) current source to directly modulate current provided to a ring oscillator; and
    a phase detector to combine the amplified RX clock with the feedback path from the PWM current source, wherein the phase detector comprises a logic gate that oversamples inputs, which together with the direct modulation of current by the PWM current source, provides a maximum PLL bandwidth that exceeds one-tenth a frequency of the amplified RX clock.

11. The system of claim 10, wherein the RX PLL further comprises:
    the ring oscillator; and
    a buffer coupled between an output of the phase detector and the PWM current source, the buffer to directly supply a combination of the RX clock and an output of the phase interpolator to PWM circuitry of the PWM current source.

12. The system of claim 10, wherein the phase interpolator is to receive:
    a phase selector code to select a set of adjacent phases of a clock signal from the ring oscillator; and
    a phase interpolator code to select a plurality of inverters from a bank of inverters that provide an output of the phase interpolator.

13. The system of claim 12, further comprising:
    an RX data amplifier that amplifies an RX data to generate an amplified RX data within a set of RX data lanes;
    a set of sampler circuits that sample the set of RX data lanes according to a multiphase, corrected RX clock; and
    a processing device coupled with the set of RX data lanes, the feed-forward clock circuitry, and the phase interpolator, the processing device to provide the phase selector code and the phase interpolator code to the phase interpolator to train the RX PLL according to relative phases between the feed-forward clock circuitry and the set of RX data lanes.

14. A communication device comprising:
feed-forward clock circuitry having a temperature-induced delay; and
a phase-locked loop (PLL) coupled to the feed-forward clock circuitry, the PLL comprising:
    a phase interpolator positioned in a feedback path of the PLL and having a negative delay that matches the temperature-induced delay of the feed-forward clock circuitry;
    a ring oscillator coupled to the phase interpolator;
    a pulse width modulation (PWM) current source to directly modulate current provided to the ring oscillator; and
    a phase detector to combine the clock with the feedback path from the ring oscillator.

15. The communication device of claim 14, wherein the feed-forward clock circuitry is to provide a clock to a sampler circuit that samples a data lane of a set of data lanes, wherein the negative delay matching the temperature-induced delay causes the sampler circuit to cancel out common noise shared between the feed-forward clock circuitry and the data lane, and wherein the common noise comprises at least one of supply noise, delay drift, or correlated random jitter.

16. The communication device of claim 14, wherein the phase detector comprises a logic gate that oversamples inputs, which together with the direct modulation of current by the PWM current source, provides a maximum PLL bandwidth that exceeds one-tenth a frequency of the clock.

17. The communication device of claim 14, wherein the feed-forward clock circuitry is to provide a clock to a sampler circuit that samples a data lane of a set of data lanes, further comprising a set of sampler circuits, which include the sampler circuit, the set of sampler circuits to sample respective data lanes of the set of data lanes, wherein the PLL generates a multiphase, corrected clock by which the set of sampler circuits is to sample the respective data lanes.

18. The communication device of claim 14, wherein the feed-forward clock circuitry comprises a first plurality of inverters that cause the temperature-induced delay, and wherein the phase interpolator comprises a second plurality of inverters with inverters that are numbered and sized according to those of the first plurality of inverters.

19. The communication device of claim 14, wherein the PLL further comprises a buffer coupled between an output of the phase detector and the PWM current source, the buffer to directly supply a combination of the clock and an output of the phase interpolator to PWM circuitry of the PWM current source.

20. The communication device of claim 14, wherein the feed-forward clock circuitry is to provide a clock to a sampler circuit that samples a data lane of a set of data lanes, wherein the phase interpolator is to receive: a phase selector code to select a set of adjacent phases of a clock signal from a ring oscillator; and a phase interpolator code to select a plurality of inverters from a bank of inverters that provide an output of the phase interpolator, the communication device further comprising a processing device coupled with the set of data lanes, the feed-forward clock circuitry, and the phase interpolator, the processing device to provide the phase selector code and the phase interpolator code to the phase interpolator to train the PLL according to relative phases between the feed-forward clock circuitry and the data lane.

\* \* \* \* \*